United States Patent
Kooijman et al.

(10) Patent No.: US 9,502,211 B1
(45) Date of Patent: Nov. 22, 2016

(54) ADAPTIVE SCANNING FOR PARTICLE SIZE USING DIRECTED BEAM SIGNAL ANALYSIS

(71) Applicant: FEI Company, Hillsboro, OR (US)

(72) Inventors: Cornelis Sander Kooijman, Veldhoven (NL); Jacob Simon Faber, Eindhoven (NL)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/702,753

(22) Filed: May 3, 2015

(51) Int. Cl.
H01J 37/26 (2006.01)
H01J 37/28 (2006.01)
H01J 37/20 (2006.01)

(52) U.S. Cl.
CPC .............. *H01J 37/265* (2013.01); *H01J 37/20* (2013.01); *H01J 37/28* (2013.01); *H01J 2237/28* (2013.01)

(58) Field of Classification Search
USPC ......... 250/396 R, 397, 492.1, 492.2, 492.21, 250/492.22, 492.23, 492.3, 306, 307, 309, 250/310, 311
See application file for complete search history.

(56) References Cited

U.S. PATENT DOCUMENTS

| | | | |
|---|---|---|---|
| 6,879,719 B1 | 4/2005 | Conrad et al. | |
| 8,250,667 B2 | 8/2012 | Svensson et al. | |
| 8,581,189 B2 | 11/2013 | Boughorbel et al. | |
| 9,041,793 B2 | 5/2015 | Bugge et al. | |
| 2003/0219658 A1* | 11/2003 | Shishido | G03F 7/70625 430/30 |
| 2004/0211925 A1 | 10/2004 | Abe | |
| 2005/0121610 A1 | 6/2005 | Abe | |
| 2005/0214958 A1* | 9/2005 | Nakasuji | G01N 23/225 438/14 |
| 2009/0218491 A1 | 9/2009 | Morokuma et al. | |
| 2012/0305763 A1 | 12/2012 | Chirko et al. | |
| 2012/0305768 A1* | 12/2012 | Yamamoto | H01J 37/28 250/310 |
| 2014/0217274 A1* | 8/2014 | Wang | H01J 37/263 250/252.1 |
| 2015/0279615 A1 | 10/2015 | Potocek et al. | |

FOREIGN PATENT DOCUMENTS

EP 2924710 9/2015

* cited by examiner

*Primary Examiner* — Nicole Ippolito
(74) *Attorney, Agent, or Firm* — Scheinberg & Associates, P.C.; Michael O. Scheinberg

(57) ABSTRACT

Methods and systems are provided for a scanning microscope to rapidly form a partial digital image of an area. The method includes performing an initial scan for the area and using initial scan to identify regions representing features of interest in the area. Then, the method performs additional adaptive scans of the regions representing structures of interest. Such scans adapt the path of the scanning beam to follow the edges of a feature of interest by performing localized scan patterns that intersect the feature edge, and directing the localized scan patterns to follow the feature edge.

20 Claims, 12 Drawing Sheets

ADAPTIVE SCANNING FOR PARTICLE SIZE USING DIRECTED BEAM SIGNAL ANALYSIS

TECHNICAL FIELD

The following is directed to methods, apparatuses, and systems for directing a charged particle or electron scanning beam along a relatively large specimen, and adaptively directing the scanning beam along the outline of features of interest.

BACKGROUND

Over the last century, the development of charged particle microscopes (CPMs) has led to the observation of natural phenomena at magnifications far greater than can be achieved in optical microscopy. The basic electron microscope has evolved into several classes of devices, such as the Transmission Electron Microscope (TEM), Scanning Electron Microscope (SEM), and Scanning Transmission Electron Microscope (STEM), and also into various sub-species, such as so-called "dual-beam" tools (such as a FIB-SEM), which combine a microscope with a "machining" Focused Ion Beam (FIB), allowing supportive activities such as ion-beam milling or Ion-Beam-Induced Deposition (IBID), for example.

In the operation of a SEM, irradiation of a specimen by a scanning electron beam causes emission of "auxiliary" radiation from the specimen, in the form of secondary electrons, backscattered electrons, X-rays and photoluminescence (infrared, visible and/or ultraviolet photons), for example. Such emissions may then be detected, alone or in combination, and accumulated over the course of scanning process to create an image.

As an alternative to using electrons as the irradiating beam, charged-particle microscopes can also use other species of charged particle. In this regard, the phrase "charged particle" should be broadly interpreted as encompassing electrons, positive ions (for example, Ga or He ions), negative ions, protons and positrons.

Typically, a scanning-type CPM microscope will comprise at least the following components:
- A radiation source, such as a Schottky electron source or an ion gun
- A focusing column of components which manipulate the radiation beam from the source by performing certain operations such as focusing, aberration mitigation, cropping (with an aperture), or filtering. The column will generally include one or more charged-particle lenses, and may comprise other types of particle-optical component also. Often, the column includes a deflector system that uses a field to deflect the output beam to perform a scanning motion across the specimen being investigated.
- A specimen holder, on which a specimen or workpiece under investigation is held and positioned (e.g. tilted, rotated). If desired, this holder may also be movable to effect a relative motion of the beam with respect to the specimen to assist in scanning. In general, such a specimen holder will be connected to a positioning system such as a mechanical stage.
- A detector, which may be unitary, or compound or distributed in nature, and which can take many different forms depending on the radiation being detected. Examples of electron detectors include scintillator-photomultiplier combinations (referred to "Everhart Thornley" detectors) and solid state detectors, including solid-state photomultipliers, photodiodes, CMOS detectors, and CCD detectors. Photon detectors can detect cathodoluminescence, light emitted as an electron impacts the sample, and x-rays and can include photovoltaic cells, photomultipliers (both tubes and solid state), and other solid state detectors.

Although various forms of scanning microscopy have been known for decades, scanning-based imaging tends to be a relatively slow and tedious process, and has therefore been limited to investigating very small specimens or portions thereof, for example on a typical scale of tens of nanometers in CPMs and tens of microns in confocal microscopy. Yet, in many technical fields that use CPMs, there is an increasing need to maintain the resolution offered by these techniques, but to expand the imaging areas by orders of magnitude. Further, in recent years, there has been increasing need to adapt SEM technologies for high-throughput applications, such as high-throughput DNA sequencing, high-speed biological sample scanning (examination of tissue), and high-speed analysis of natural resources samples (examination of core samples).

Another problem with present-day scanning microscopy techniques can occur when imaging radiation-sensitive specimens, such as biological specimens, cryogenic specimens, etc. The issue in this case is that the act of irradiating such specimens with an energetic beam (particularly a charged-particle beam) tends to damage the specimen by causing molecular re-arrangement or mutation, thawing, or desiccation. To mitigate this effect, some existing systems reduce the intensity or increase the scan speed of the irradiating beam. However, such measures generally lead to an undesirable decrease in signal-to-noise ratio (SNR).

Further, forming a high resolution digital scan of a 3D volume by a scanning electron microscope (SEM)/focused ion beam (FIB) dual beam device is a useful tool in the fields of biology and natural resource exploitation. In this technique, the FIB repeatedly removes a thin layer of the volume to be imaged, repeatedly exposing surfaces for the SEM to image. The process may collect of an immense amount of data, typically in the giga-pixel range. Such collection is typically a slow process, taking anywhere from 4 to 60 hours, which limits the useful throughput of the device and its usefulness in situations where multiple samples need to be imaged quickly. Scanning a large image field with sparse filling of objects/particles of interest is a therefore rather inefficient process in any of the fields discussed above.

SUMMARY

Provided are systems and methods that adaptively track or follow the contour of a particle or feature of interest with the charged particle microscope scanning beam. The method includes performing an initial scan pattern for an area and using initial scan to identify regions representing features of interest in the area. Next, the method performing additional adaptive localized scans of the regions representing structures or features of interest. Such scans adapt the path of the scanning beam to follow the edges of a feature of interest by performing localized scan patterns that intersect the feature edge, and directing the localized scan patterns to follow the feature edge based on analysis of the detector output. To do so, the preferred version makes use of a repetitive circular motion of the scanning beam along the edge of the particle by analyzing the detector signal which is recorded during the motion, calculating the required direction and subsequently driving the beam in the right direction. The typical scanning circle dimension is as small as two to ten times the beam diameter, but may be much larger. Multiple circular scans may improve the SNR.

When only the size or constitution of the individual particles is necessary it is sufficient to capture the contours of the features without scanning the entire feature with the beam. This can help minimize damage from the beam to sensitive samples. Further the invention provides a way to record the shape which may be useful to direct further analysis, greatly speeding the desired analytical insights in various fields. For example, analysis of the shape data can provide the centroid and therefore also put the beam in the center of the particle to do chemical analysis. Further, the shapes can identify features where operators desire total or more comprehensive beam scans.

Charged particle microscope systems are also provided, which are programmed to analyze the detector output to direct the adaptive scanning process. The systems may include adaptive scanning control circuitry coupled to the detector to control a series of localized scan patterns that track the feature edge. Such circuitry may also include analytics for determining phase information from the detector signal, providing feedback to the process by which subsequent localized scan patterns are directed. Such adaptive analysis may also be done by a specially programmed processor.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the scope of the invention as set forth in the appended claims.

BRIEF DESCRIPTION OF THE DRAWINGS

For a more thorough understanding of the present disclosure, and advantages thereof, reference is now made to the following descriptions taken in conjunction with the accompanying drawings.

DETAILED DESCRIPTION

Figure 1:
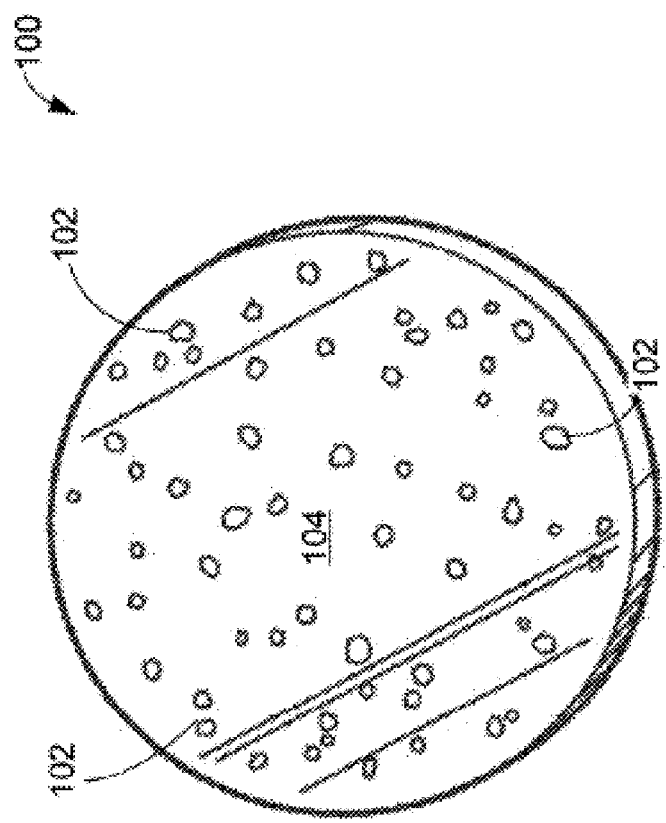
FIG. 1 shows an example sample workpiece of a specimen to be examined, set in epoxy.

In the drawings and description that follow, similar reference numerals may refer to similar components in different embodiments disclosed herein. The drawing figures are not necessarily to scale. Certain features of the invention may be shown exaggerated in scale or in somewhat schematic form and some details of conventional elements are omitted for clarity. The present invention is susceptible to embodiments of different forms. While specific embodiments are described in detail and are shown in the drawings, the present disclosure is not intended to limit the invention to the embodiments herein. The different features discussed herein may be employed separately or in any suitable combination to produce desired results.

In the following discussion and in the claims, the terms "including" and "comprising" are used in an open-ended fashion, and thus should be interpreted to mean "including, but not limited to . . . . " To the extent that any term is not specially defined in this specification, the intent is that the term is to be given its plain and ordinary meaning. Furthermore, use of the term "and/or" herein shall be construed as an "inclusive" or, and not an "exclusive" or. For example, used herein the phrase "A and/or B" would mean "A, B, or A and B." As another example, used herein the phrase "A, B, and/or C" would mean "A, B, C, or any combination thereof." Further, whenever the terms "automatic," "automated," or similar terms are used herein, those terms will be understood to include manual initiation of the automatic or automated process or step. Still further, the term "specimens" will be used herein to convey both singular and plural meanings, except where such use would conflict with the context and in cases where the singular case is separately addressed by the disclosure. For example, an embodiment wherein "specimens are scanned with a beam" is intended to convey an embodiment wherein "a specimen is scanned with a beam" as well as the embodiment wherein "specimens are scanned with a beam."

FIG. 1 shows an example workpiece including a sample specimen set in epoxy to be examined in a scan. The depicted sample 100 has features 102 embedded in epoxy matrix 104. In this example the features 102 are granules of a mineral sample from a mine or a drilling well, but other types of specimens may be examined, with or without an epoxy matrix, such as life sciences (biological or DNA type samples), natural resources, materials sciences, and semiconductors, to name a few. Almost any field using charged particle microscopy of the various types described above to examine specimens, or newly developed types not discussed herein, can benefit from the invention as set forth herein. Further, the techniques described herein may further be used with FIB-SEM type systems that use an ion beam to mill away layers, either generally or directed only near specific features, to create 3D data scanning rather than a single layer scan. Other embodiments employ suitable techniques to cut away portions or layers of the sample, to conduct scans as set forth herein on the cutaway portions or on the remaining sample. For example, one version uses serial block face sectioning with a microtome, and scans the sample as described herein after each slice is removed by the microtome. Another version uses a microtome or other suitable technique to slice away a layer, and then scans that layer as described herein.

Figure 2:
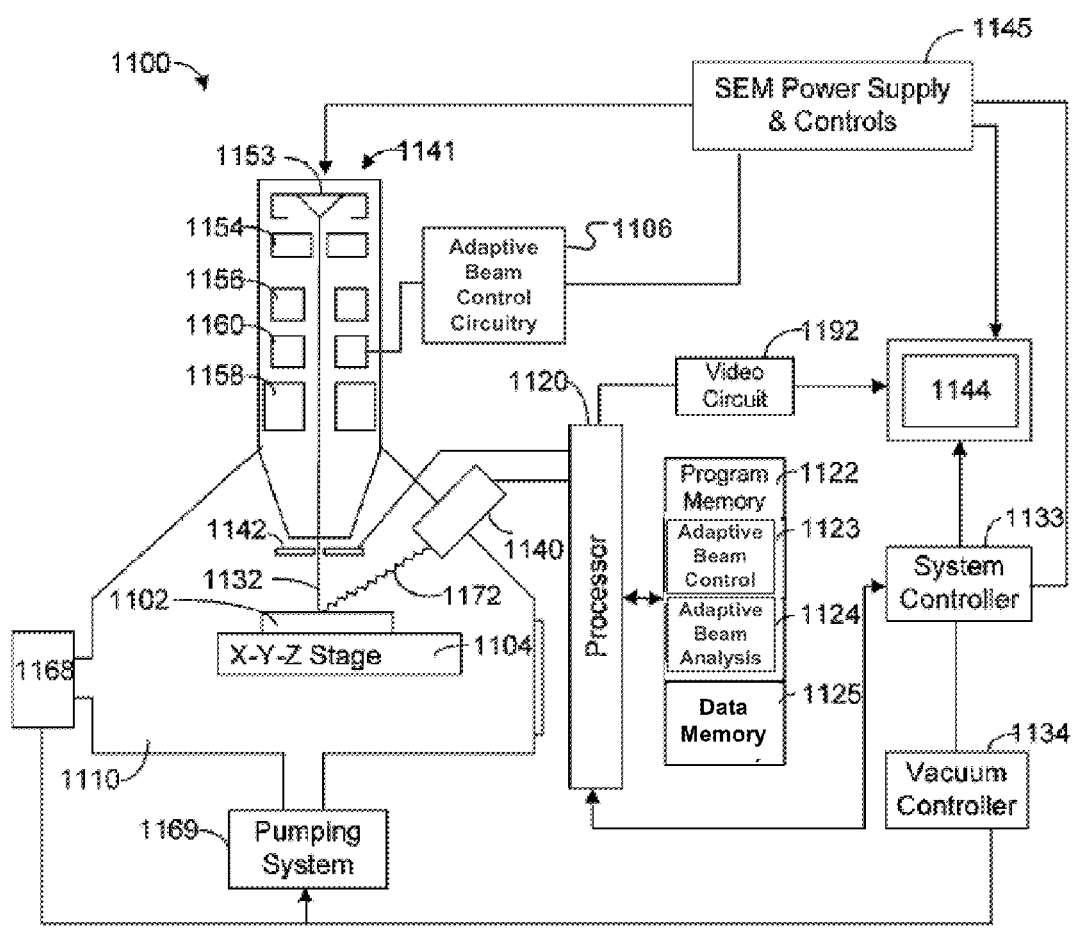
FIG. 2 shows a scanning electron beam system with an x-ray detector, according to one or more embodiments.

FIG. 2 shows a scanning electron beam system 1100, with a secondary electron detector 1174, an x-ray detector 1140 and backscattered electron detector 1142, preferably a segmented silicon drift detector. Scanning electron beam system 1100 is suitable for practicing some embodiments of the present invention. The invention can provide benefits in any scanning beam system. Other embodiments may employ other scanning devices, for example, a Scanning Transmission Electron Microscope (STEM), a focused ion beam system (FIB), and combinations thereof, such as a "dual-beam" system including an electron beam column and an ion beam column. System 1100 includes a scanning electron microscope 1141, along with power supply and control unit 1145. In operation, an electron beam 1132 is emitted from a cathode 1153 by applying voltage between cathode 1153 and an anode (not shown). Electron beam 1132 is focused to a fine spot by means of a condensing lens 1154 and an objective lens 1158. Electron beam 1132 is scanned two-dimensionally on the specimen by means of a deflection coil or deflection plates 1156 and 1160 ("deflectors"). The deflection coils or plates can deflect the beam along the x-axis and along the y-axis so that the beam can be scanned along a sample surface in a simple or complex pattern, such as a raster scan, serpentine scan, or a Hilbert scan. Deflectors 1156 and 1160 may be magnetic or electrostatic. Operation of condensing lens 1154, objective lens 1158, and deflectors 1156 and 1160 is controlled by power supply and control unit 1145, under direction of the system controller 1133. In this embodiment, system 1100 further includes adaptive beam control circuitry 1106, which performs fine adjustments to the deflectors 1156 and 1160 during localized scan patterns according to the techniques further described below. While control circuitry 1106 is shown connected to control unit 1145, it may further be connected to the processor 1120 or a digital signal processor (DSP) to perform certain calculations and feedback control functions as discussed below.

System controller 1133 directs the operations of the various parts of scanning electron beam system 1100. The vacuum chamber 1110 is evacuated with ion pump 1168 and mechanical pumping system 1169 under the control of vacuum controller 1134. Electron beam 1132 can be focused onto sample 1102, which is on a movable X-Y-Z stage 1104 within lower vacuum chamber 1110. When the electrons in the electron beam strike sample 1102, the sample gives off low energy secondary electrons, back-scattered electrons, and x-rays whose energy correlates to the elements in the sample. Secondary electrons and/or backscattered electrons are detected by secondary electron detector 1174 and/or backscatter electron detector 1142. An image is formed on display 1144, in which the gray level of each pixel of the image corresponds to the secondary electron current or backscatter electron current detected when the beam is positioned at a corresponding location on the sample surface. The term "image" is not limited to something that is displayed on a screen—"image" can be an electronic representation that is stored in memory and/or analyzed by the computer with or without displaying the image to a person. X-rays 1172 having energy inherent to the elemental composition of the sample are also produced in the vicinity of the electron beam incident region. Emitted x-rays are collected by x-ray detector 1140, preferably an energy dispersive detector of the silicon drift detector type, although other types of detectors could be employed, which generate a signal having an amplitude proportional to the energy of the detected x-ray.

Output from detector 1140, or 1142 is amplified and sorted by a processor 1120, which can comprise, for example, a microprocessor, a micro controller, a DSP, a programmable gate array or any other digital or analog circuitry. When detecting x-rays, processor 1120 sorts the total number of x-rays detected during a specified period of time, at a selected energy and energy resolution, and a channel width (energy range) of preferably between 10-20 electron-volts (eV) per channel. The spectrum is compared to known spectra to determine the composition of the point, and can be used to create a compositional map. Processor 1120 can comprise a computer processor, programmable gate array, or other digital or analog processing means; operator interface means (such as a keyboard or computer mouse); program memory 1122 for storing data and executable instructions; interface means for data input and output, executable software instructions embodied in executable computer program code; and display 1144 for displaying the image derived from one or more of the detectors by way of video circuit 1192. Program memory 1122 includes adaptive beam control programming 1123, and adaptive beam analysis programming 1124, which are used to direct the adaptive localized scans in various embodiments as further described below. Further, while such programming and functionality is shown in this embodiment resident at processor 1120, this is not limiting and the system controller 1133 or a dedicated adaptive scan controller such as a DSP may be added to some versions. Whatever controller is used for the adaptive techniques described herein, it should receive output from the detectors 1140 and/or 1142 (or another type of detector used in other embodiments) and be operatively connected to direct operation of the adaptive beam control circuitry 1106. Other versions may include a dedicated DSP or math co-processor in the adaptive beam control circuitry 1106, the processor 1120, or system controller 1133, to hold and execute the adaptive beam control programming 1123, and adaptive beam analysis programming 1124. The design of such processing capability may be selected according to the particular distribution of functionality between the adaptive beam control circuitry 1106 and the processors or controllers, the volume of data needed to be analyzed, the throughput of the various system busses, and speed of calculations, for example.

Processor 1120 can be a part of a standard laboratory personal computer, and is typically coupled to at least some form of computer-readable media. Computer-readable media, which include both volatile and nonvolatile media, removable and non-removable media, may be any available medium that can be accessed by processor 1120. By way of example and not limitation, computer-readable media comprise computer storage media and communication media. Computer storage media include volatile and nonvolatile, removable and non-removable media implemented in any method or technology for storage of information such as computer-readable instructions, data structures, program modules or other data. For example, computer storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that can be used to store the desired information and that can be accessed by processor 1120.

Program memory 1122 can include computer storage media in the form of removable and/or non-removable, volatile and/or nonvolatile memory and can provide storage of computer-readable instructions, data structures, program modules and other data. Generally, the processor 1120 is programmed by means of instructions stored at different times in the various computer-readable storage media of the computer. Programs and operating systems are typically distributed, for example CD-ROMs or via USB thumb drives or internet downloads. From there, they are installed or loaded into the secondary memory of a computer. At execution, they are loaded at least partially into the processor's primary electronic memory. The invention described herein includes these and other various types of computer-readable storage media when such media contain instructions or programs for implementing the steps described below in conjunction with a microprocessor or other data processor. The invention also includes the computer itself when programmed according to the methods and techniques described herein. A secondary electron image, backscattered electron image, or other detector data obtained from the scan may be stored in a portion of data memory 1125, and saved to higher-capacity memory for analysis or long term storage, along with analytical data points such as vectors and intersection locations described below.

Figure 3:
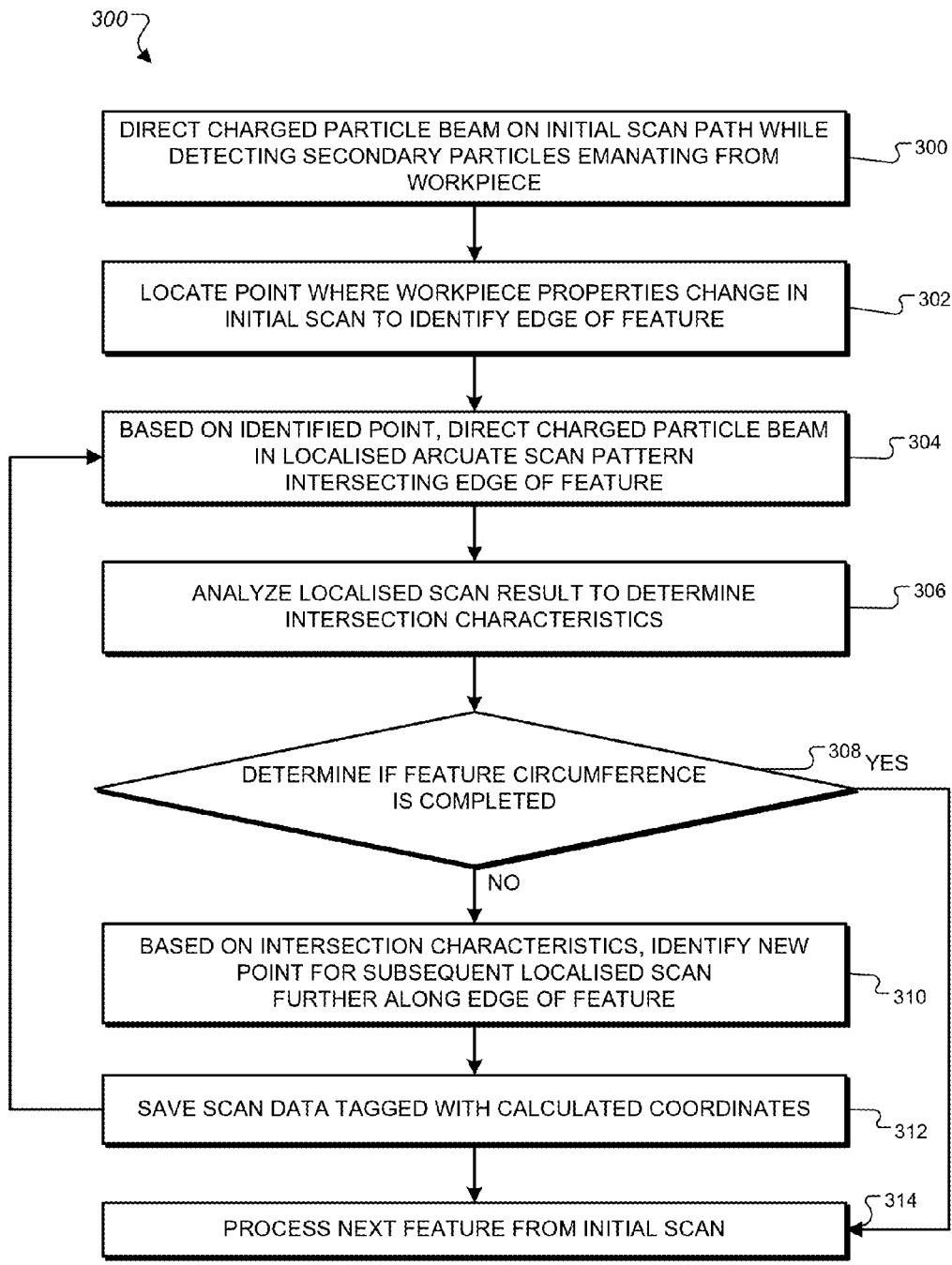
FIG. 3 is a flow diagram of a process for locating and adaptively imaging specimens on a sample by following the contours or edges of a target feature or particle.

FIG. 3 is a flow diagram of a process 300 for locating and adaptively imaging specimens on a sample by following the contours or edges of a target feature or particle according to an example embodiment of the invention. The depicted process may be useful, for example, when only the size or constitution of the individual particles or features is needed. The process makes it possible to record the shape of the feature without a scan of the entire feature area. From this, calculations can provide characterizing data such as the centroid and therefore also lead to further analysis such as a scan putting the beam in the center of the particle to do further analysis, such as energy dispersive x-ray spectroscopy to determine the mineral content of the target feature. It is understood that the process steps described with regard to the flow charts herein may be implemented by adaptive beam control programming code 1123 and adaptive beam analysis programming code 1124, in cooperation with adaptive beam control circuitry 1106, or similarly programmed and structured components in a variety of charged particle microscope architectures as discussed above.

Assuming the sample workpiece, such as that shown in FIG. 1, for example, is loaded into the scanning device, the depicted process 300 begins at block 301 where it directs the charged particle beam on an initial scan path over the workpiece while detecting secondary particles, such as secondary electrons or backscattered electrons, emanating from the workpiece as a result of the beam. The initial scanning path may take a number of forms, such as a raster, grid, large serpentine, a nested group of small serpentine patterns, or other repeating pattern chosen to cover the working area of the scan in low detail or low resolution. This initial scan may use relatively large beam widths or use narrow beam widths spaced relatively far apart, as compared to the desired highest resolution scan of the workpiece. Other types of scan patterns, such as scan patterns defined by continuous fractal curves such as Hilbert or Moore curves, may be used. Preferably if such curves or patterns are used, their parameters are set to not fill the entire plane of the scan for the initial scan. That is, typically at the initial scan will employ a scan pattern that does not fill the entire plane, or fills the plane but with a much lower resolution (larger pixels with lower pixel density) scan than the localized scans conducted later in the process. In some versions, the initial scan may be conducted with one beam or scan technology, and the localized scans with another. The present embodiment employs the same beam type for both scans.

At block 302, the process locates a point in the initial scan data where the properties change in a manner that identifies the edge of a localized feature. This is typically a low-to-high or high-to-low transition point. For example, in a secondary electron or backscattered electron image, the transition may correspond to a change in gray level. Using an x-ray, the transition may correspond to a change in the number of x-rays detected or a change in x-ray energy indicating a change in composition. Based on the identified point, the process at block 304 directs the particle beam in a localized curved scan pattern that intersects the edge of the feature. The localized curved scan pattern may take different forms as further described below, but preferably is designed to intersect the edge of the feature at least twice during each arc or curve of the pattern. The pattern may be repeated across the same area to improve signal-to-noise characteristics in the resulting data. At block 306, the process analyzes the resulting scan data to determine certain desired characteristics of how the localized curved scan pattern intersects the edge of the feature. Such analysis may take several forms below, but generally determines where in the arc or curve of the pattern the edge of the feature is crossed. The analysis is preferably performed by adaptive beam control analysis programming 1124 (FIG. 2). However, in some cases analog control circuitry may be employed inside of the adaptive beam control circuitry 1106, to perform some or all of the analysis involved.

Next, at block 308, the process determines if the localized scanning has completed the circumference of the outer edges of the target feature. This may be performed in a number of ways as further described below, but generally determines if the present localized scan pattern has overlapped the first localized scan pattern for the present feature. If so, the target feature has been circumnavigated, and the scan data for the entire feature is saved in block 312 so the process can move on to the next target feature found in the initial scan at block 314.

If the circumference has not been completed at block 308, the process goes to block 310 where it identifies a new point to begin the next localized scan pattern, based on the characteristics of the present pattern's intersection with the feature edge, calculated or selected to move the next scan further along the feature edge in the direction not previously scanned. Such point may be determined in several ways as further described below, but generally involves identifying or calculating a point that is further along the circumference of the feature, near or on the feature edge. With the point determined at block 310, the process returns to block 304 to start a new localized scan pattern based on the new identified point. As can be understood from this disclosure, such process provides a way to direct the beam along the circumference of a feature, determining the size, shape, and boundary of the feature with much less beam activity than a complete scan of the feature. In various embodiments, process 300 may be part of a larger analysis process in which the identified features are further completely scanned, or the size, shape, and boundaries are analyzed manually or automatically to select features to scan completely based on data needed by the operators.

Figure 4:
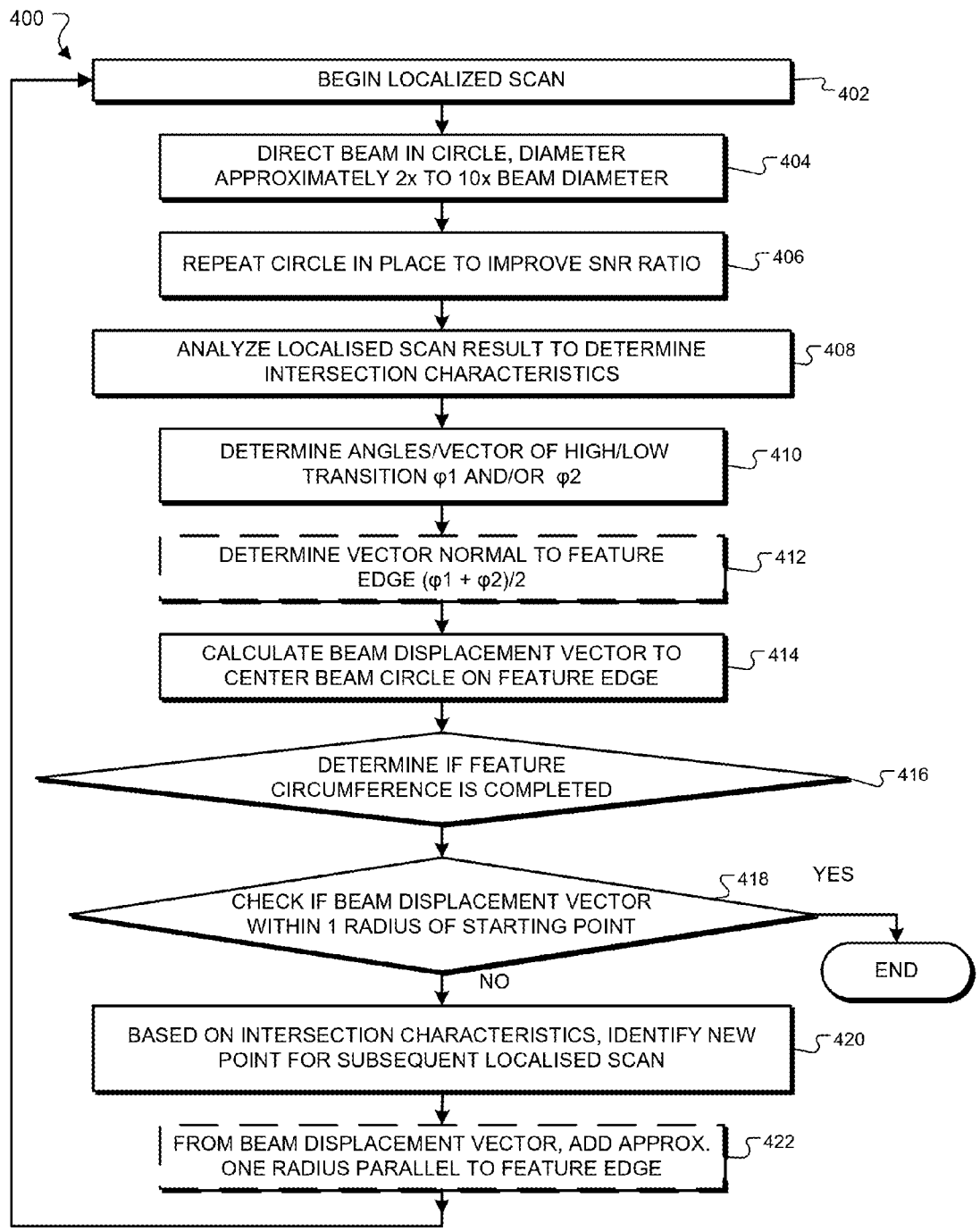
FIG. 4 is a flow diagram of a process showing detailed steps for one example version of conducting the localized scan of process of FIG. 3.
Figure 6:
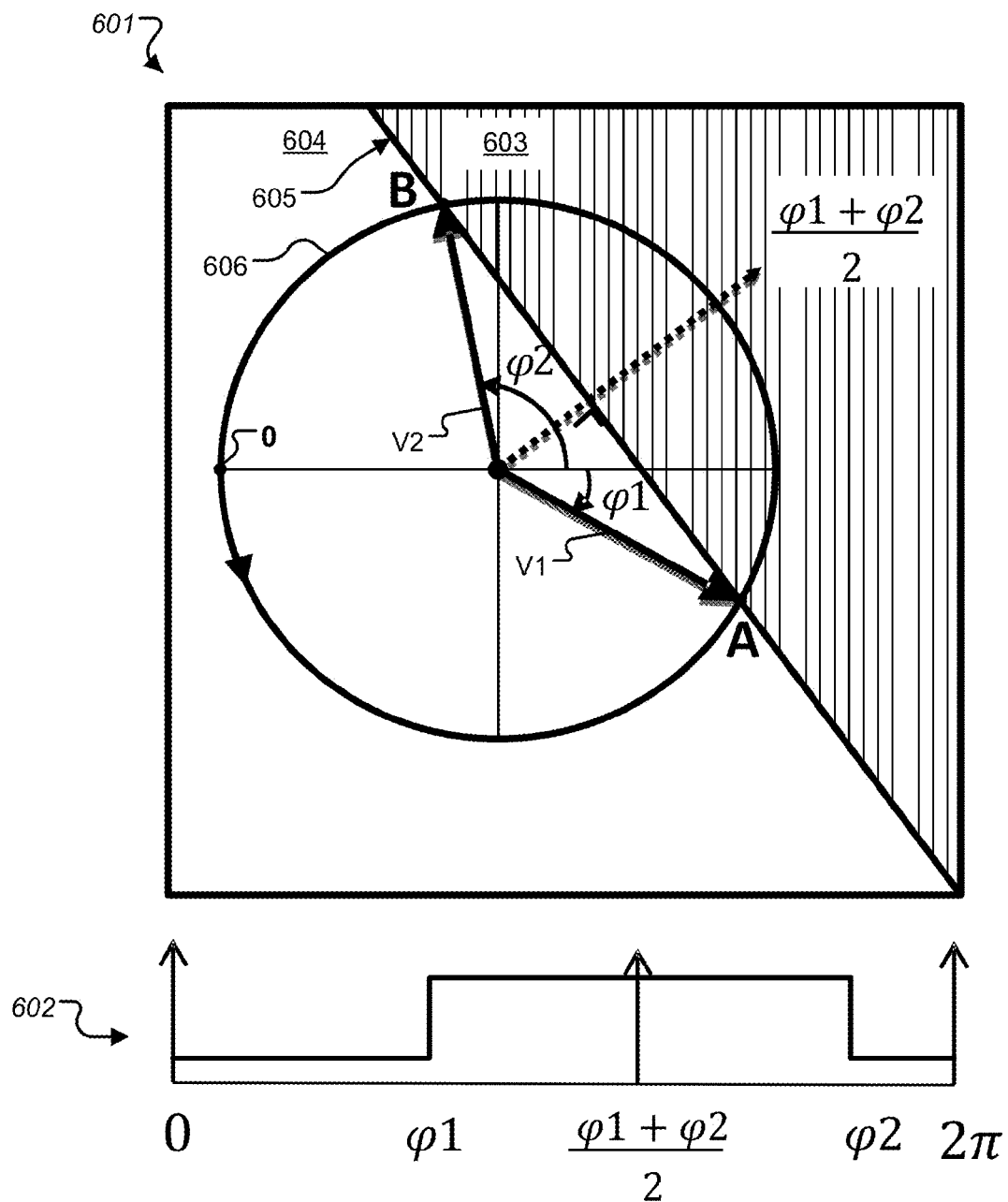
FIGS. 6-7 are a sequence of diagrams and detector output graphs showing an example scenario of localized beam scans along a feature boundary.

FIG. 4 is a flow diagram of a process 400 showing detailed steps according to one embodiment for conducting the localized scan of process 300 after an edge of the feature is identified in step 302. This example process uses a circular beam path that is moved along the edge of the feature as described. However, this is not limiting and other shapes for the beam path may be used, along with other methods of determining the intersection of the beam path with the feature edge. The process described here is further depicted graphically in FIGS. 6-8. FIG. 6 shows a diagram view of the beam path 606 relative to an enlarged edge of feature 603, and a graph 602 of the scan detector intensity relative to the path. Referring to FIGS. 4 and 6-8, the process begins an individual localized scan pattern at block 402, based on a point provided from the process start (for the first localized scan) or from the previous scan pattern. The process start point for the first localized scan, marked 0 in FIG. 6, is chosen to be near the boundary 605 of the feature 603, but preferably not directly on the boundary, as shown in the diagram 601 of the beam path 606 in FIG. 6. For example, the starting point 0 may be chosen by moving a random distance, or a predetermined distance, outside the feature edge point identified from the initial scan results (block 302, FIG. 3) to begin the localized scan process. Other versions may provide a starting point inside the feature boundary 605, again removed by some selected distance from the edge.

From the starting point, the process goes to block 404, where it directs the beam in a circle, such as the example localized scan path which in this version is circular beam path 606, with a diameter chosen suitably larger than the beam diameter, for example 2× to 10×, or even larger. The circle is centered on or near boundary 605 as estimated in step 302. The rotation of the circle may be either direction, in the example path it is shown to be counterclockwise across the graph starting at the point marked zero. The diameter may also be selected based on the expected size of features anticipated or found in the sample workpiece. For example, if large features are anticipated, on the order of many thousands of times the beam width, the circle diameter may be selected as larger than 10× the beam diameter in order to more quickly traverse the edges of the target feature, while not missing contours of the feature by selecting a circle size much larger than an expected contour might be. Further, the diameter of the circle may be limited (on the small end of the range) by the maximum frequencies allowed through the beam deflection circuitry, which at the time of writing is typically in the MHz range, along with the desired or achievable beam movement speed. After directing the circular beam at block 404, the process may repeat the circle at block 406, to improve the signal to noise ratio of the scan, for example. The scan detector is active during the circle, with data being recorded, and an example detector output is shown in the graph 602 for the circular scan path 606. Note that the graph 602 is idealized to show high and low, but an actual signal will contain more irregular data due to material variations, the slope of the boundaries involved, the beam profile, and noise.

Next, at block 408, the process analyzes the localized scan result (the detector output along with its known path) to determine the characteristics of where the scan path intersected the boundary of the feature. The analysis of the scan result under block 408 (which broken into detail in blocks 410, 412, and 414) may be conducted by digital signal processing or analog circuitry (or a mixture thereof), with the purpose to characterize the edge of the feature by finding at least one of the depicted angles $\phi1$ and/or $\phi2$, from which can be determined a vector normal to the edge, and therefore the angle of the edge relative to the scanning coordinate system so that the boundary can be followed. At block 410, the process locates the traversal or intersection of the beam from the area 604 outside of feature 603 to inside at intersection point A (vector V1 from the circle origin, at angle $\phi1$); which traversal causes a low to high transition as also observed on the graph at angle $\phi1$. Of course, depending on the type of sample material analyzed, the surrounding medium or features, the beam and detector technology, and the sample fixing medium, the interior of feature 603 may cause a lower detector output rather than higher. In this example, feature 603 causes a higher output than the surrounding area 604.

Further, as shown in the detector output graph 602 for this example scenario, the intersection of the beam path 606 with the feature edge 605 at point B (vector V2, angle $\phi2$ on the graph) causes a detector level transition from high to low. Note that in this version the vector angles are measured relative to an origin that is not the starting point of the circular localized scan path. However, this is not limiting and the computational reference point may be changed as desired from the traditional analytical origin point depicted on diagram 601. The rotation on graph 602 is noted as zero radians at the beam path starting point 0. What is required is that the circular beam path 606 is crossing the edge 605 of the target feature or particle 603. Having a known circular beam path which crosses in such manner, one can look for the transitions of the detector output signal, depicted on the graph, as compared with the signal average, yielding by the time of transition rotational angle $\phi1$ and/or $\phi2$ of the circular beam path 606.

If desired, at process block 412 which is shown as a dotted optional block, both vectors $\phi1$ and $\phi2$ may be determined, from which the process at block 412 determines or calculates a vector normal to the feature edge, the depicted vector $(\phi1+\phi2)/2$. This vector data may be saved with the scan data to provide the angle of the feature edge for each localized scan. Next, at block 414, having found the angle $\phi1$, the process calculates (based on the known circle origin and radius) the beam displacement vector that will put the circle center in position A, depicted in FIG. 7 as the configuration for the subsequent localized scan. That is, the process may use position A at block 420 to move the localized scans along the edge of feature 603. Before moving to the next localized scan, the process at block 416 determines if the circumnavigation of the present target feature has been completed, and if so ends the localized scans for the present feature. Preferably, such determination is made by checking if the point A at the end of the beam displacement vector is within one circular scan radius of the starting point. Repeating the localized scan blocks as shown in the FIG. 4 flowchart, will cause the circle center to move alongside the contour of the particle where the dark area will be always on the left hand side.

Figure 7:
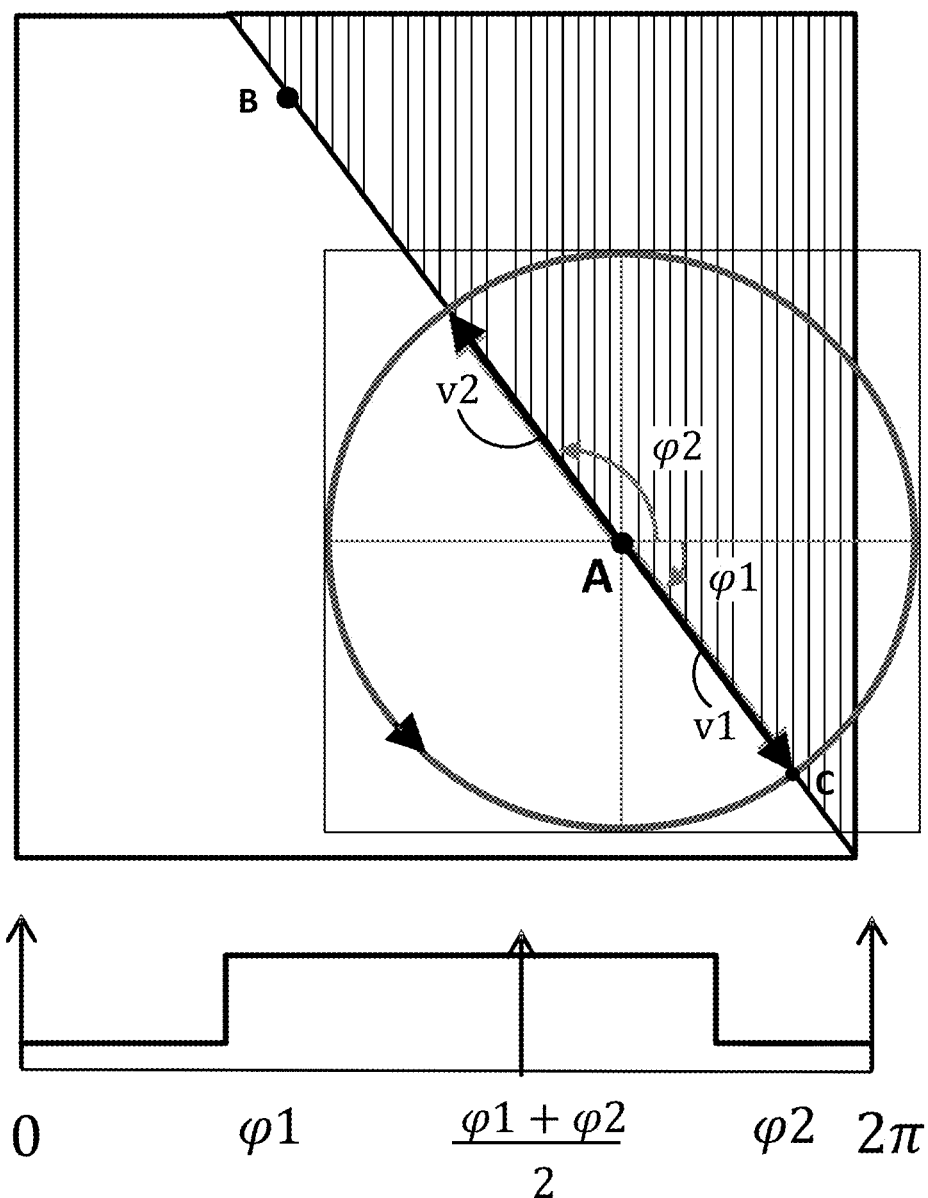

Referring to FIG. 7, a subsequent localize scan is performed using point A from the previous scan as the center of the scan circle. V1 is then chosen as the beam displacement vector to use in the next step at block 414, the circle center will move downwards to point C, and the dark area 603 of the feature will be always on the right hand side of the localized circular scans 606 (with reference to right and left in the drawing).

Some embodiments employ the normal vector $((\phi1+\phi2)/2)$ to move the subsequent localized scan further along the edge 605 than merely moving to the end of the beam displacement vector calculated at block 414. In such versions, optional block 422 may be used, which starts with the determined beam displacement vector and adds a determined distance parallel to the feature edge. In this preferred example, the distance added is one circular scan radius. The new point thus calculated, further along the edge in either desired direction, is then used as the starting point for the subsequent localized scan back at block 402. For example, the process at blocks 420 and 422 may calculate or identify some measurement or metric of edge smoothness, and under the condition that such data currently indicates the edge is smooth, the starting point might be moved further than position A. In such embodiments, block 422 can add as much as a circle diameter to the calculated beam displacement vector 422. Some versions may include only two modes, a smooth edge mode that adds a circle diameter, and a rough edge mode that adds only a circle radius, while other versions may vary the amount added between a radius and a diameter based on the smoothness measurement or metric.

Figure 8:
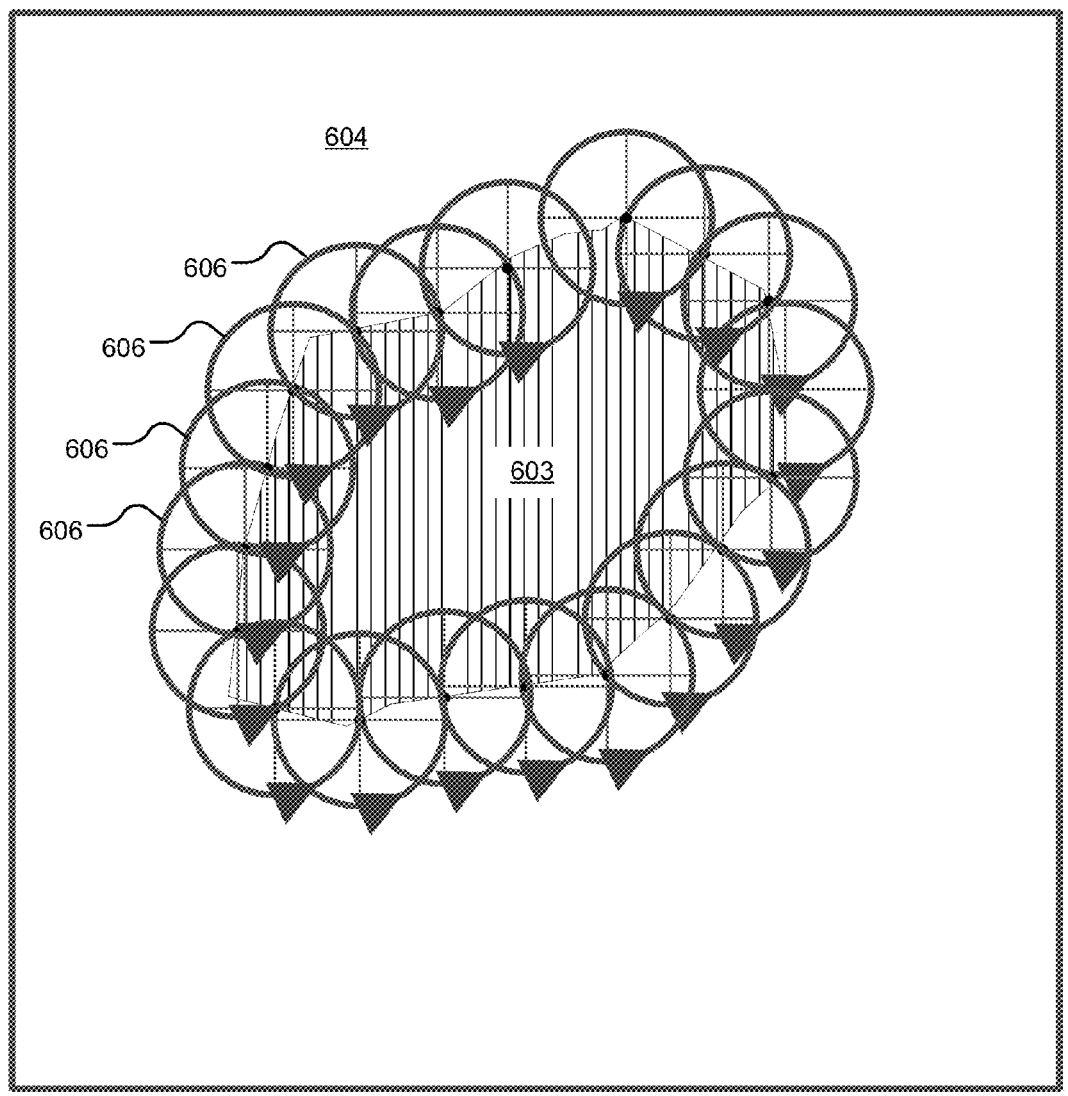
FIG. 8 is a diagram showing a completed sequence of localized scans around a feature boundary.

By recording all coordinates during this process it is possible to reconstruct the shape of the particle. This process is performed by tagging the data. As shown in FIG. 8, the process provides a circumnavigation of the selected target feature, but does not require a detailed scan of the entire feature. Instead, multiple localized scans, and their various coordinates and calculated normal vectors, provide sufficient data to characterize the size, contours, and topology of the target feature, and may further provide enough scan data through the saved detector output data of each localized circular scan to provide the desired analytical insights needed to characterize the feature. As can be understood, the processes described herein may provide ability to characterize a feature to the extent needed by the operator using much less beam scanning than a process that scans every point of the feature. For example, in some versions, the localized scan patterns characterize the edges of the feature as described above while scanning less than 20% of the total number of points that would be required to scan the entire feature. Other versions may of course follow up this process by using the centroid of the feature to conduct further scanning, or by performing a detailed scan of all or a selected portion of the feature using the characterizing data thus produced. During the fast circular scans which are highly predictable it is readily possible to generate image data of a small band, twice the circle radius, along the contour of the particle. The stepping size shown in FIG. 8 is chosen to be one radius of the circle, however as discussed above, this is not limiting and smaller or larger steps may be selected, depending on the resolution requirement in the area around the edge of the particle.

Figure 5A:
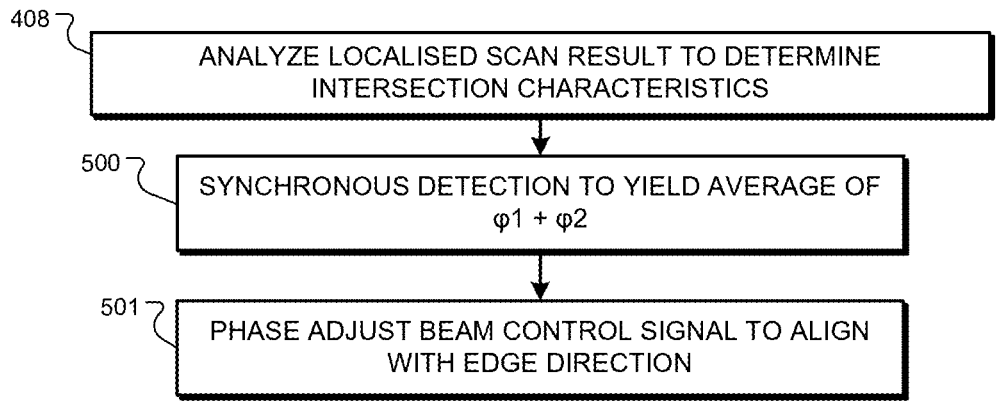
FIGS. 5A-C are flow diagrams for some example alternative processes of analyzing local beam scan results according to other embodiments.
Figure 5B:
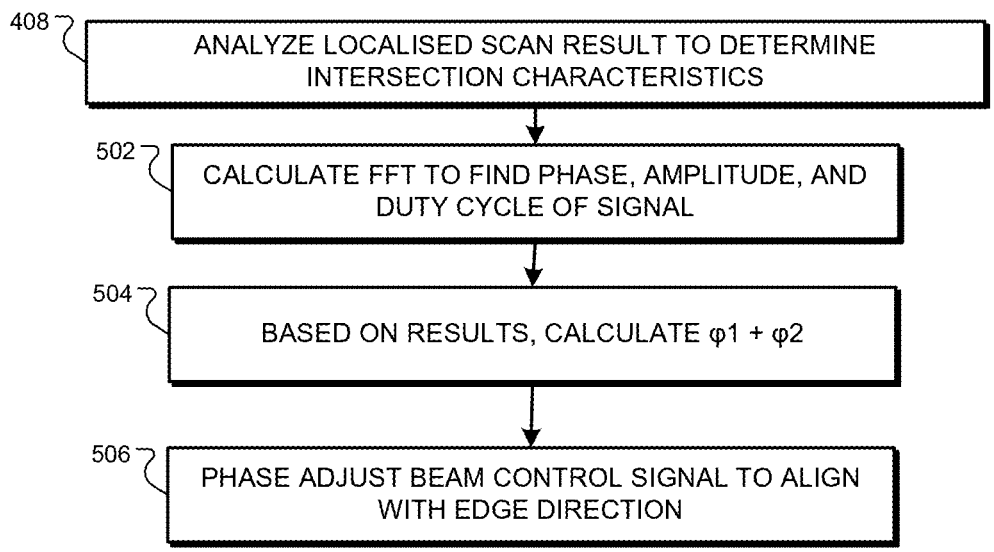
Figure 5C:
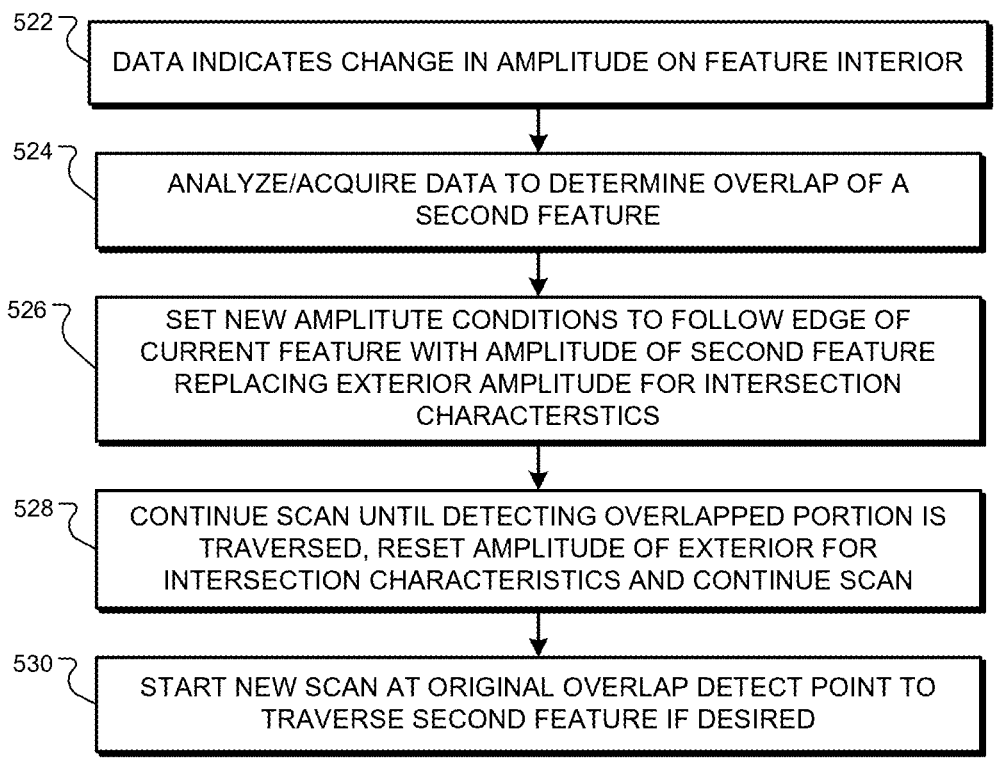

FIGS. 5A-C are flow diagrams for some example alternative processes of analyzing local beam scan results according to other embodiments. As found in FIG. 5A, an alternative process of block 408 for analyzing the localized scan result to determine intersection characteristics may include, as shown at block 500, applying an analog signal analysis technique such as synchronous detection on the detector output signal for the series localized scan result. Such known techniques may be employed to detect the phase of the high portion of the signal, yielding the phase of $(\phi 1+\phi 2)/2$, and thereby giving the shortest path from the circular beam path 606 origin center to the particle edge 605. The edge direction, orthogonal to such vector, may also be produced based on the vector output from such techniques. Further, such techniques may be conducted with analog circuitry or digital signal processing as known in the art. Next, the process at block 501 phase adjust the control signals going to the beam deflectors to align the subsequent localized scan pattern 606 with the feature edge 605.

FIG. 5B shows another example process for analyzing local beam scan results. In this version, the detector output is processed using fast Fourier analysis to determine phase, amplitude and duty cycle of the signal at block 502. It should be noted that the duty cycle alone can be employed as a fairly accurate indication of how far the circle center is from the feature edge 605, for example when the circle is centered on the edge the duty cycle will be approximately 50%. From this data, the process at block 504 calculates the vectors $\phi 1$ and $\phi 2$, which yield the required data to phase adjust the localized scan pattern control signals (block 504) as discussed above. The calculations described may be made by processor 1120, for example. In some implementations, the processor 1120 of FIG. 2 may be a system on chip (SoC) or processing module that includes a digital signal processor (DSP) to assist in making such calculations.

FIG. 5C shows a flowchart of an example process for analyzing a scenario in which the scan encounters overlapping features 603, which may be overlapping particles or other types of features depending on the field of study. In some situations overlapping features may appear so similar that they are followed by the scan as a single feature, while in others the detector output amplitude may reflect a change allowing the detection of an overlapping feature. To handle such a scenario, the process in FIG. 5C starts at block 522 where it detects that data indicates a change in amplitude of the current features interior area 603. In response, the process goes to step 524, where it may analyze the acquired data further or acquire further surrounding data to determine that an overlap with a second feature exists, the second feature causing a different amplitude signal in its interior. For example, this step may determine that the output signal has three regions with distinct amplitude levels. Or, this step may move the beam further along the edge of region 604 to confirm a second feature exists by confirming the interior amplitude measurement consistently changes. Other techniques may also be used at block 524 to determine the presence of a second overlapping feature. If none exists the process continues a normal scan. If a second overlapping feature exists, the process at step 526 follows the original feature by setting new amplitude conditions to follow edge of current feature with amplitude of second feature replacing exterior amplitude for determining intersection characteristics according to the techniques herein. The new exterior amplitude (the amplitude inside the second feature) may in some cases be higher or lower than the amplitude inside the feature being traversed. Using these new amplitude characteristics, the process at step 528 continues the scan around the present feature, until detecting that the overlapped portion is traversed by detecting a similar condition to that at step 524, that is the exterior amplitude is reached again or a similar analysis to step 524 determines a boundary of overlapping features is present. Upon such detection, the process at step 528 resets the amplitude of the exterior for use in analyzing the intersection characteristics, and finishes the scan of the current particle. Preferably, the process will tag overlap intersection points such as those detected at steps 524 and 528. Next at 530, the process may start a new scan of the second feature by using scan data and location of either detection point to being a scan along the edge of the second feature in the direction away from the first feature. The process steps 522 and 528 may, of course, be repeated more than once while circumnavigating a particular feature, if more than one additional feature overlaps the feature being scanned.

Figure 11:
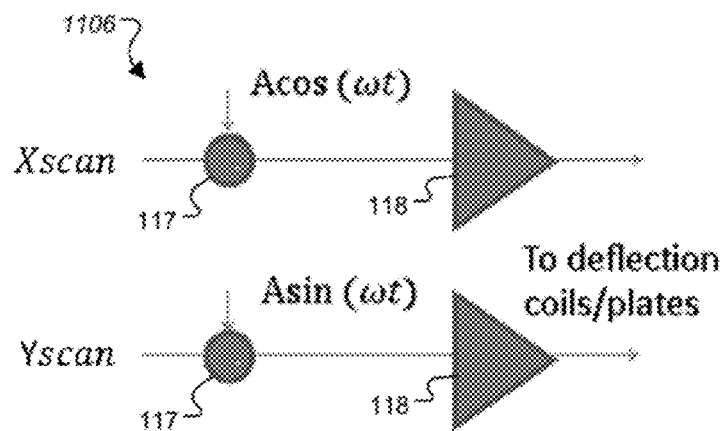
FIG. 11 is a circuit diagram showing control localized scan beam control circuitry according to one example embodiment.

FIG. 11 shows an example adaptive beam control circuit 1106 that may be used for generation of the circular motion. As shown, the Xscan and Yscan positional signal generated from the controller may be modified by superimposing a sine and cosine to them, to produce the circular localized scan patterns as described in the embodiment of FIG. 6. If the bandwidth of the output lineup from the controller all the way to the plate or coil at the deflector is high enough, the sine and cosine variations may be added digitally into the Xscan and Yscan signals. This is also straightforward in the analog domain, as shown in the depicted circuit where the A $\cos(\omega t)$ and A $\sin(\omega t)$ are produced by appropriate oscillator circuitry and added to the Xscan and Yscan signals by adders 117. The modified signals are then passed through the driver/amplifier 118 for delivery to the deflector plate or coil. Another alternative design is to capacitively couple the sine and cosine perturbations directly at the coils or plates, after the amplifiers 1118, so that the limited bandwidth of the amplifier does not impose a restriction on the circular scan speed.

Figure 12:
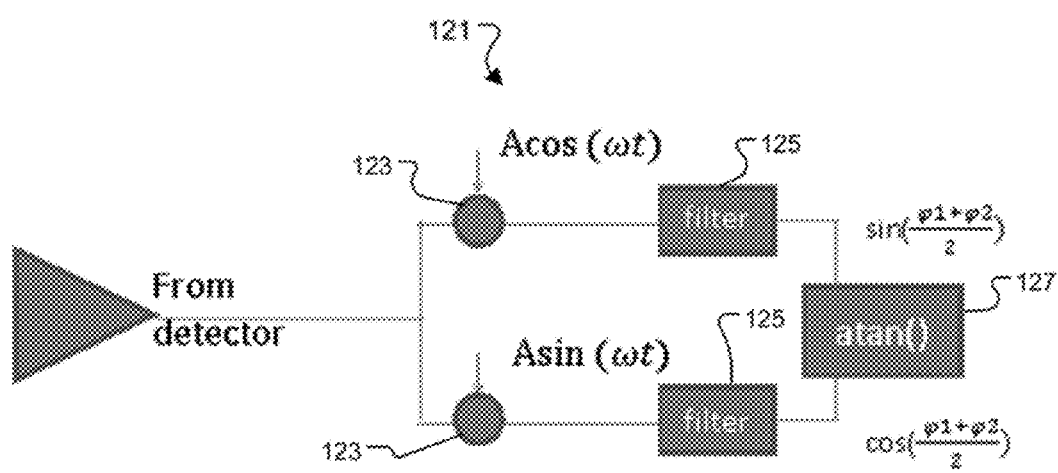
FIG. 12 is a circuit diagram showing localized scan detector output analysis circuitry according to one example embodiment.

FIG. 12 depicts a phase detector circuit 121 which may be provided in adaptive beam control circuitry 1106 in some embodiments. Phase detector circuit 121 receives the amplified scan detector output and passes it to two mixers 123, for comparison with the respective sine and cosine signals previously used to drive the Xscan and Yscan variations of the deflectors. The results are lowpass filtered by filters 125, and then the arc-tangent of the two resulting signals is calculated by circuit 127 to provide the signal needed to direct the beam movement direction for the movement between successive localized scans. Naturally, proper phase correction of the signal is needed to align the movement with the edge direction. Further, while this example uses synchronous type phase detection, other control circuits may be used, such as a simple duty cycle detector on the beam detector output, which may be connected to steer the direction of the succeeding local scans to keep the duty cycle near 50%.

Figure 9:
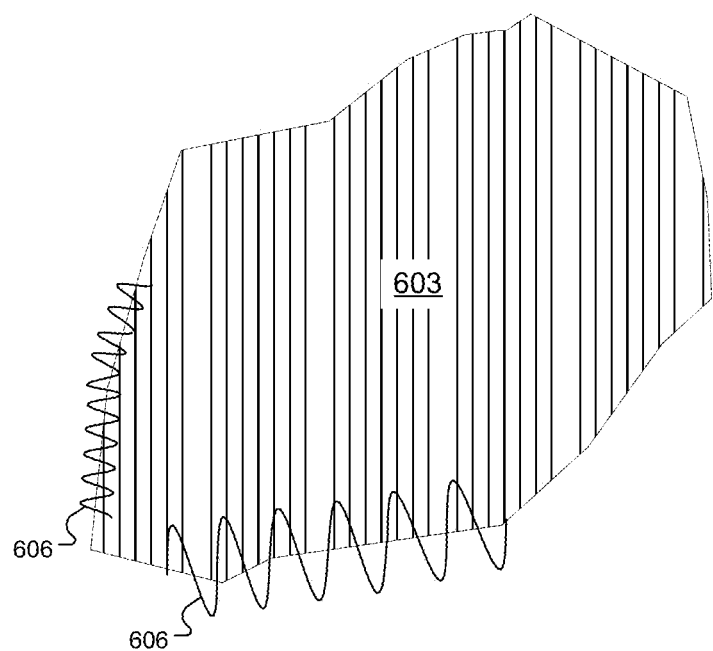
FIGS. 9-10 are diagrams showing alternative shapes for the localized scan beam movement according to other embodiments.

Referring now to FIG. 9, a feature 603 is shown in diagram form with two alternative localized scan beam paths 606 depicted along selected edges of the feature. In this version, the repeating localized scan pattern is not a circle, but instead takes the shape of a sine wave, which is added to the beam Xscan and Yscan position signal as it moves in a direction along the edge of feature 606. Such a scheme may be beneficial in certain applications where the signal to noise ratio does not require repeating circles or other repeating patterns to cover the localized scan area more than once. The localized scan is steered along the edge using variations of the techniques discussed above. For this scheme, the Xscan and Yscan are employed for constant movement down the center of the depicted localized waveform, which will then be oscillated by the added sine wave signal. The sine wave must be broken down into X and Y components depending on the travel direction, which can be done in hardware or software according to the concepts described herein. For example, the high/low duty cycle of the detector output may be determined, and the direction of the beam movement adjusted to keep the cycle near 50%, and thereby follow the edge of feature 606. In use, the waveform would follow the entire circumference of the feature to obtain the desired data regarding the feature shape and outline. For features with more complex shapes or variations, a higher frequency of sine wave may be employed such as the left depicted localized scan pattern 606. For situations where relatively large or smooth-edged features are expected, a lower frequency scan pattern such as the lower depicted localized beam scan pattern may be used. With this technique also, knowing the precise location of the starting point for each sine wave of the pattern, combined with the data from the detector output, the intersection points of the localized waveform with the feature edge can be determined. The amplitude of the sinusoidal variations may also be varied according to expected feature characteristics in the workpiece. It is noted that in this embodiment, the localized beam scan patterns are preferably continuously connected with the beam not blanked before starting a new localized scan. However, this is not limiting and the beam may be blanked while moving to the starting point determined for a beginning a subsequent localized scan (block 304 in FIG. 3). Further, it is noted that while circular and sinusoidal shaped localized scan patterns are described herein, this is not limiting and other suitable shapes may be used, preferably designed to intersect the feature edge at least twice within each localized scan in to provide ability to extract suitable information about the feature edge, such as the normal vector which yields the edge orientation.

Figure 10:
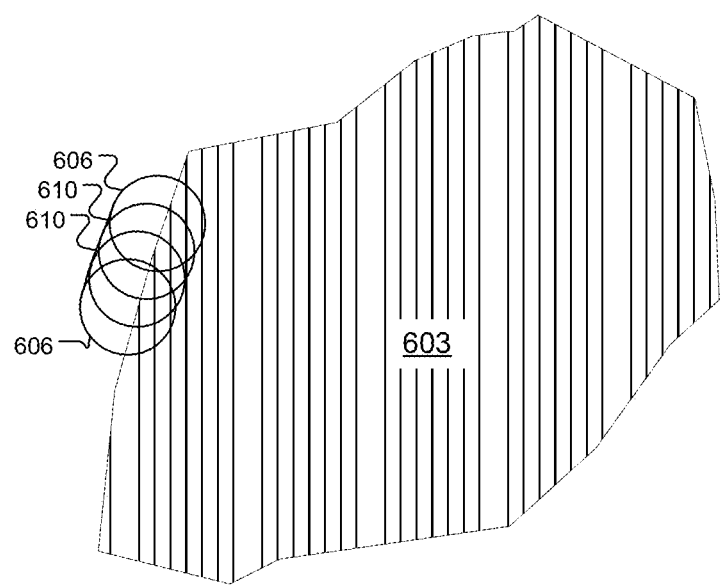

FIG. 10 shows another alternative localized beam scan waveform, in diagram form on an example feature 603. In this embodiment, the localized beam scan patterns 606 are circular, but the beam is not blanked while moving from one localized scan to the next. This produces a continuous beam with a linking beam path 610 connecting the adjacent localized beam scan patterns 606. The process can be arranged such that linking beam path 610 appears outside the feature edges as depicted, to minimize beam exposure to the feature, or appears inside to maximize detector data extracted from the feature as the localized scans proceed. Alternatively, the linking beam path 610 may always appear on the same relative side, such as the left depicted side in FIG. 10 to maintain the same orientation for each localized scan. Such techniques may be used with localized scans of various shapes, and are not limited to circles as described herein, although circles present some advantages due to the ease and speed of calculating the various intersection characteristics as discussed above.

It should be recognized that embodiments of the present invention can be implemented via computer hardware or software, or a combination of both. The methods can be implemented in computer programs using standard programming techniques—including a computer-readable storage medium configured with a computer program, where the storage medium so configured causes a computer to operate in a specific and predefined manner—according to the methods and figures described in this specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, sensors, and the like. Aspects of the present invention may be implemented in machine readable code stored as memory on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible workpiece objects, including producing a particular visual depiction of the physical and tangible objects on a display.

Preferred embodiments of the present invention may make use of a particle beam apparatus, energy beam apparatus, or apparatus using a physical probe tip in order to image a sample. Such beams or physical probes used to image a sample inherently interact with the sample resulting in some degree of physical transformation. Further, throughout the present specification, discussions utilizing terms such as "calculating," "determining," "measuring," "generating," "detecting," "forming," "resetting," "reading," "subtracting," "detecting," "comparing," "acquiring," "mapping," "recording," "transforming," "changing," or the like, also refer to the action and processes of a computer system, a sensor, or similar electronic device, that manipulates and transforms data represented as physical quantities within the computer system into other data similarly represented as physical quantities within the computer system or other information storage, transmission or display devices.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for carrying out some embodiments of the present invention are commercially available, for example, from FEI Company, the assignee of the present application.

The various features described herein may be used in any functional combination or sub-combination, and not merely those combinations described in the embodiments herein. As such, this disclosure should be interpreted as providing written description of any such combination or sub-combination.

Further, whenever the terms "automatic," "automated," or similar terms are used herein, those terms will be understood to include manual initiation of the automatic or automated process or step. Whenever a scan or image is being processed automatically using computer processing, it should be understood that the raw image data can be processed without ever generating an actual viewable image. In the following discussion and in the claims, the terms "including" and "comprising" are used in an open-ended fashion, and thus should be interpreted to mean "including, but not limited to . . . ."

To the extent that any term is not specially defined in this specification, the intent is that the term is to be given its plain and ordinary meaning in the art, in the context in which it is used. The accompanying drawings are intended to aid in understanding the present invention and, unless otherwise indicated, are not drawn to scale. Although the present invention and its advantages have been described in detail, it should be understood that various changes, substitutions and alterations can be made herein without departing from the invention as defined by the appended claims. Moreover, the present application is not intended to be limited to the particular embodiments of the process, machine, manufacture, composition of matter, means, methods and steps described in the specification.

As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the claims are intended to include such processes, machines, manufacture, compositions of matter, means, methods, or steps.

The invention claimed is:

1. A method of scanning using a charged particle beam, comprising:
    (a) directing a charged particle beam toward a workpiece in an initial scan pattern within a field of view while detecting secondary particles emanating from the workpiece surface in response to impact of the charged particle beam, the secondary particles corresponding to a property of the workpiece;
    (b) determining a point along the initial scan pattern at which a property of the workpiece changes to identify a point on an edge of a feature in the workpiece;
    (c) directing the charged particle beam in a localized scan pattern, the starting point of the subsequent localized scan pattern being determined by the point identified on the edge of the feature, the subsequent localized scan pattern intersecting the edge of the feature at one or more intersection point as determined by a change in the property of the workpiece at the edge; and
    (d) directing the charged particle beam in a plurality of subsequent localized scan patterns, with the starting point of the subsequent localized scan patterns being determined based on the intersection points of one or more previous localized scan patterns with the edge of the feature in order to determine multiple points of the edge of the feature to trace an outline of the feature.

2. The method of claim 1 in which directing the charged particle beam in a subsequent localized scan pattern includes directing the charged particle beam in a curved scan pattern.

3. The method of claim 2 in which directing the charged particle beam in curved scan pattern comprises directing the beam in a circle.

4. The method of claim 3 in which the radius of the circle is between two times the beam diameter to ten times the beam diameter.

5. The method of claim 3 in which the beam is scanned in the circle multiple times to improve the signal-to-noise ratio.

6. The method of claim 3 in which determining the starting point of the subsequent localized scan pattern includes determining an angle of a vector from the center of the circular scan and one of the points of intersection of the scan with the edge.

7. The method of claim 1, in which determining the starting point of the subsequent localized scan patterns includes determining a vector normal to the feature edge and selecting a starting point moved parallel to the feature edge with respect to the previous localized scan pattern.

8. The method of claim 1 in which determining a point along the scan pattern where a property of the scan changes by at least a predetermined amount comprises determining a point along the scan pattern where the number of secondary electrons or backscattered electrons changes by a predetermined amount.

9. The method of claim 1 in which the location of the subsequent localized scan patterns is determined relative to one of the previously located points on the edge of the feature.

10. The method of claim 1 further comprising determining a duty cycle of a detector signal from the subsequent localized scan patterns, the duty cycle indicative of how long the scan pattern is inside the feature edge and how long it is outside the feature edge.

11. The method of claim 1 in which the total number of points scanned to determine the outline of the feature is less than 20% of the total number of points required to scan the entire feature.

12. A charged particle beam microscope for observing a workpiece, comprising:
(a) a source of charged particles;
(b) a focusing column for forming the charged particles into a beam;
(c) a deflector for scanning the beam in a pattern directed at the workpiece;
(d) a detector for detecting particles emanating from the workpiece surface in response to impact of the charged particle beam, the detected particles being used to form at least a partial image of the workpiece;
(e) a controller for controlling the charged particle beam microscope;
(f) a memory storing computer readable instructions for instructing the controller to operate the microscope to
(i) direct a charged particle beam toward a workpiece in an initial scan pattern within a field of view while detecting secondary particles emanating from the workpiece surface in response to impact of the charged particle beam, the secondary particles corresponding to a property of the workpiece;
(ii) determine a point along the initial scan pattern at which a property of the workpiece changes to identify a point on an edge of a feature in the workpiece;
(iii) direct the charged particle beam in a localized scan pattern, the starting point of the subsequent scan pattern being determined by the point identified on the edge of the feature, the subsequent localized scan pattern intersecting the edge of the feature at one or more intersection point as determined by a change in the property of the workpiece at the edge; and
(iv) direct the charged particle beam in a plurality of subsequent localized scan patterns, with the starting point of the subsequent localized scan patterns being determined based on the intersection points of one or more previous localized scan patterns with the edge of the feature in order to determine multiple points of the edge of the feature to trace an outline of the feature.

13. The charged particle beam microscope of claim 12, further comprising adaptive beam control circuitry operatively coupled to the deflector for directing the beam in localized scan patterns.

14. The charged particle beam microscope of claim 13, in which the adaptive beam control circuitry further comprises phase analysis circuitry operable to analyze a phase of an output signal from the detector.

15. The charged particle beam microscope of claim 12, in which the memory storing computer readable instructions for instructing the controller to operate the microscope to direct the charged particle beam in a subsequent localized scan pattern includes a memory storing computer readable instructions for instructing the controller to operate the microscope to direct the charged particle beam in a curved scan pattern.

16. The charged particle beam microscope of claim 15, in which directing the charged particle beam in curved scan pattern comprises directing the beam in a circle.

17. The charged particle beam microscope of claim 12, in which the memory storing computer readable instructions for instructing the controller to operate the microscope to determine the starting point of the subsequent localized scan pattern includes a memory storing computer readable instructions for instructing the controller to operate the microscope to determine an angle of a vector from the center of the circular scan and one of the points of intersection of the scan with the edge.

18. The charged particle beam microscope of claim 12, in which the memory storing computer readable instructions for instructing the controller to operate the microscope to determine the starting point of the subsequent localized scan patterns includes a memory storing computer readable instructions for instructing the controller to operate the microscope to determine a vector normal to the feature edge and selecting a starting point moved parallel to the feature edge with respect to the previous localized scan pattern.

19. The charged particle beam microscope of claim 12, in which the memory storing computer readable instructions further stores computer readable instruction for instructing the controller to operate the microscope to determine a duty cycle of a detector signal from the subsequent localized scan patterns, the duty cycle indicative of how long the scan pattern is inside the feature edge and how long it is outside the feature edge.

20. The charged particle beam microscope of claim 12, in which the memory storing computer readable instructions further stores computer readable instructions for instructing the controller to operate the microscope to repeat localized scan patterns until the localized scan patterns have been conducted around the entire edge of the feature.

* * * * *